(12) United States Patent
Supriya et al.

(10) Patent No.: US 7,727,886 B2
(45) Date of Patent: Jun. 1, 2010

(54) FORMING VIAS USING SACRIFICIAL MATERIAL

(75) Inventors: Lakshmi Supriya, Chandler, AZ (US); Omar J. Bchir, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 11/824,212

(22) Filed: Jun. 29, 2007

(65) Prior Publication Data

US 2009/0004841 A1    Jan. 1, 2009

(51) Int. Cl.
*H01L 21/4763* (2006.01)
(52) U.S. Cl. ............... 438/637; 438/618; 257/E21.585; 257/E21.587
(58) Field of Classification Search ............ 438/618, 438/637, 670; 257/E21.577, E21.585, E21.587
See application file for complete search history.

(56) References Cited

U.S. PATENT DOCUMENTS

2008/0070349 A1 * 3/2008 Matayabas et al. .......... 438/121

2008/0160177 A1 * 7/2008 Mataybas et al. .......... 427/98.5

OTHER PUBLICATIONS

U.S. Appl. No. 11/533,653, filed Sep. 20, 2006, entitled "Formation of Holes in Substrates Using Dewetting Coatings," by James C. Matayabas, Jr., et al.
U.S. Appl. No. 11/618,528, filed Dec. 29, 2006, entitled "Methods for Electroless Plating of Metal Traces on a Substrate and Devices and Systems Thereof," by J. C. Matayabas, Jr., et al.

* cited by examiner

*Primary Examiner*—Ha Tran T Nguyen
*Assistant Examiner*—Daniel Whalen
(74) *Attorney, Agent, or Firm*—Trop, Pruner & Hu, P.C.

(57) ABSTRACT

In one embodiment, the present invention includes a method for forming a sacrificial material layer, patterning it to obtain a first patterned sacrificial material layer, embedding the first patterned sacrificial material layer into a dielectric material, treating the first patterned sacrificial material layer to remove it to thus provide a patterned dielectric layer having a plurality of openings in which vias may be formed. Other embodiments are described and claimed.

11 Claims, 2 Drawing Sheets

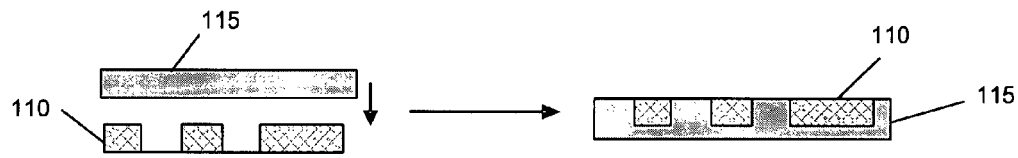
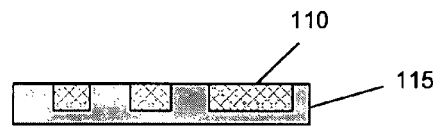
FIG. 2A    FIG. 2B
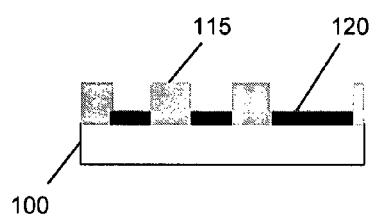
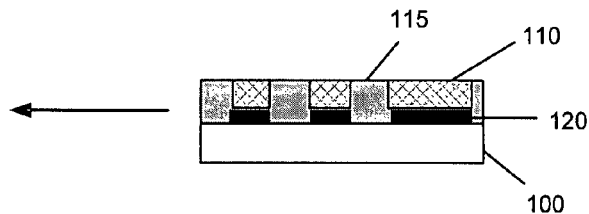
FIG. 2D    FIG. 2C
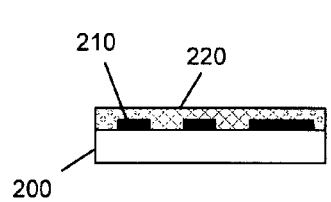
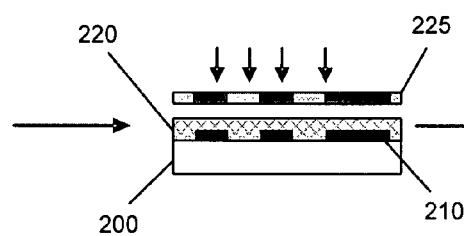
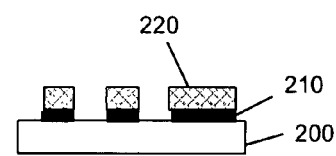
FIG. 3A    FIG. 3B    FIG. 3C
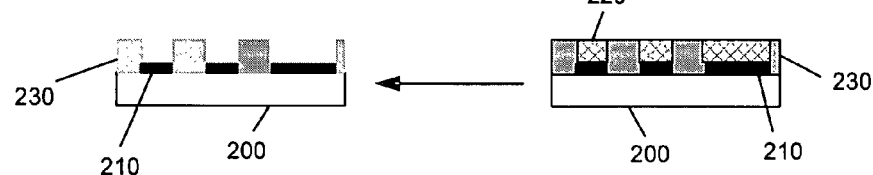
FIG. 3E    FIG. 3D

FORMING VIAS USING SACRIFICIAL MATERIAL

BACKGROUND

Semiconductor devices are typically formed on a semiconductor die, which is then packaged in a package including a substrate. Substrate capacity and cost is a concern for the microelectronics industry. A substrate can include so-called vias, which are conductive structures to connect different metal layers in the substrate. As advances occur, the cost for laser drilling vias is increasing due to the increasing number of vias and decreasing size of the vias, which forces the innovation of new laser technologies. Due to the increasing number of vias, the throughput time of substrate manufacturing is increased.

Substrates can be formed of organic material including a core and multiple layers of patterned copper separated by dielectric polymer and interconnected by vias. The vias can be formed by carbon dioxide ($CO_2$) laser drilling. This process can be time consuming, and limited to via diameters greater than about 50 microns. Further, practical concerns such as laser via to pad alignment and manufacturing throughput time restrict substrate design to a single via diameter per buildup (BU) layer.

BRIEF DESCRIPTION OF THE DRAWINGS

FIGS. 2A-2D are process flow diagrams of a method in accordance with one embodiment of the present invention.

FIGS. 3A-3E are process flow diagrams of a method in accordance with another embodiment of the present invention

DETAILED DESCRIPTION

Figure 1:
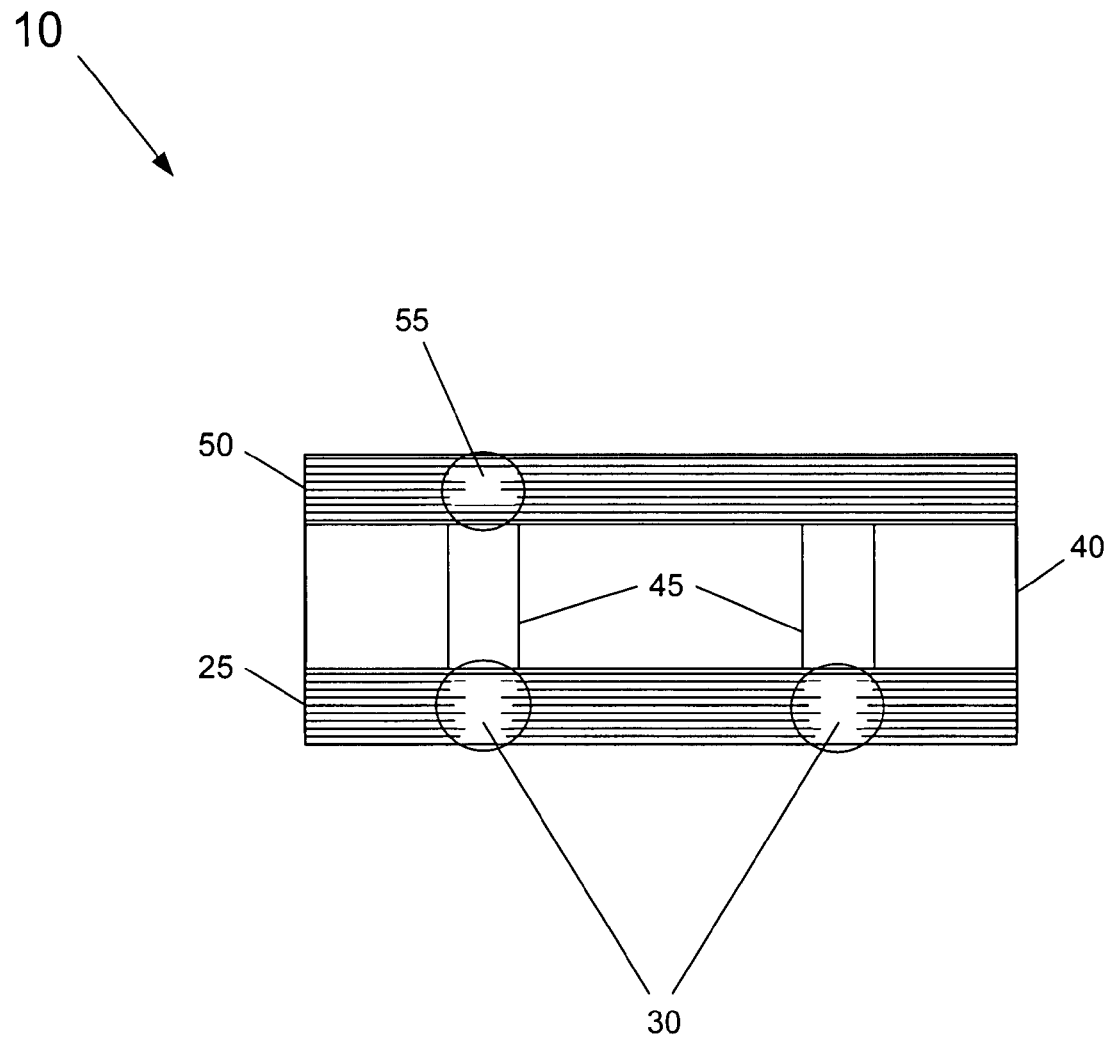
FIG. 1 is a cross-section view of a substrate in accordance with an embodiment of the present invention.

In various embodiments, microvias may be formed in a substrate such as a package substrate or other such substrate using sacrificial materials. While the scope of the present invention is not limited in this regard, such microvias may have diameters of less than approximately 30 microns and up to greater than approximately 120 microns, in some embodiments. In this way, the need for other methods of forming microvias such as using laser techniques can be avoided. In different implementations, sacrificial material may be patterned into shapes that the microvias will take. Then a process to embed the sacrificial material into a dielectric may be performed. The sacrificial material may then be removed, leaving openings in the dielectric. These openings may then be used to form microvias, e.g., by plating of a conductive material such as a metal, by an electroless or electrolytic plating process.

Referring now to FIG. 1, shown is a cross-section view of a substrate in accordance with an embodiment of the present invention. As shown in FIG. 1, substrate 10 may include a plurality of conductive planes 25, which in some embodiments may be copper (Cu) planes. Between conductive planes 25, dielectric layers may be present, such as formed using a polymer. Contacts may be made between conductive plates 25 by a plurality of microvias 30. In various embodiments, the area for the microvias may be formed using a sacrificial material in accordance with an embodiment of the present invention.

In various embodiments, a core material 40 may be a polymer or other dielectric material, which can be reinforced with glass fibers. Connections may be made through core material 40 by a plurality of plated through holes (PTHs) 45. Above core material 40, conductive planes may be present with dielectric layers 50 separating them. Microvias 30 and 55 are formed in the BU dielectric layers to make electrical connections between the metal layers in the buildup, and are typically metallized using an electroless or electrolytic deposition technique. Microvias 30 and 55, which are typically formed by laser drilling may instead be formed in accordance with an embodiment of the present invention. Although shown as a core-type package, the scope of the present invention is not limited in this regard and other embodiments may be used in a coreless substrate.

Referring now to FIGS. 2A-2D, shown is a process flow of a method in accordance with one embodiment of the present invention. As shown in FIG. 2A, a sacrificial material 110 may be patterned in a desired manner. A number of different sacrificial materials may be used, where a stimulus to later remove the material may either be thermal, light, microwave, or any other method. When using a thermal stimulus, the phase change (sublimation) temperature may range from room temperature to approximately 400° Celsius (C). Examples of such materials may include, but are not limited to, naphthalene and its derivatives (sublimes slowly at room temperature but may be made to sublime faster at higher temperatures, e.g., approximately 50° C.), camphor (or other terpene based systems), polycarbonates (and its derivatives) (sublimation temperature of ~200° C.), poly(norbornene) and derivatives (sublimation temperature of ~400° C.). The materials may also be made photosensitive by adding photoinitiators such as, but not limited to Irgacure 819, Irgacure 369 etc. By using such materials, they may be placed on desired regions simply by photopatterning. The sacrificial material may be deposited by spin-coating, printing or other methods.

Various photolithography or other processes may be performed to obtain a desired pattern of sacrificial material 110. Then sacrificial material 110 may be embedded within a dielectric 115. A wide variety of dielectric polymers may be used. Examples of dielectric polymers include thermoplastics, such as polyimides, polyesters, polyamides, and polyolefins, and thermosets, such as epoxies and bismaleimides. A wide variety of methods may be used to place a uniform dielectric coating, including vacuum lamination, spin coating, and other methods known in the art. In various embodiments, a lamination or solvent casting of dielectric 115 on sacrificial material 110 may be performed to embed sacrificial material 110 within dielectric 115, as shown in FIG. 2B. In one embodiment, the sacrificial material is polycarbonate and the dielectric material is a polyimide. The polycarbonate is patterned analogous to a metal pattern on a substrate such that it can be easily removed. The polyimide film is taken slightly above the glass transition temperature (Tg) such that it softens and is pressed onto the patterned polycarbonate, such that it is embedded into the film. The polycarbonate embedded dielectric film is laminated onto the substrate. In another embodiment, the sacrificial material is patterned by photolithography, etching or other methods on a surface, from which it may be easily removed. The dielectric polymer is poured over the patterned sacrificial material and solvent cast to form a film with the sacrificial material embedded in it. Alternatively, the sacrificial material may be patterned directly on the substrate and the dielectric solvent cast on the substrate.

To position a sacrificial material where microvias are desired to be located, a deposition process may be performed to apply dielectric 115 including sacrificial material 110 onto a substrate. More specifically, as shown in FIG. 2C, a substrate 100, which may be a package substrate or other substrate, may have conductive interconnects 120, which may be Cu pads or lines to provide interconnections to lower layers (not shown in FIG. 2C) of substrate 100. Accordingly, dielectric layer 115 may be deposited above substrate 100 as shown in FIG. 2C, e.g., by a lamination process. Then to eliminate sacrificial material 110, a given treatment process may be performed such as an ultraviolet (UV) treatment or a thermal treatment to release sacrificial material 110, resulting in the structure shown in FIG. 2D, which is a cross section view of a substrate including openings for formation of microvias. Of course, the microvias may then be metallized by a plating process.

FIGS. 3A-3E show a similar method for forming microvias using sacrificial materials. However, note that various differences in the processes exist. In the embodiment of FIG. 3A, a sacrificial material 220 is deposited onto a substrate 200 that includes patterned conductive interconnects 210, such as patterned Cu pads/lines, although other metals such as aluminum, silver, gold and others may be used. In various embodiments, sacrificial material 220 may be coated onto substrate 200. In one embodiment, the sacrificial material is modified poly(norbornene) with a photoinitiator. The sacrificial material is coated onto the patterned substrate by spin-coating. Then sacrificial material 220 may be patterned using photolithography in connection with a mask 225, as shown in FIG. 3B. After such UV treatment, sacrificial material 220 is patterned as shown in FIG. 3C. Then deposition of a dielectric material 230 may be performed. For example, a dielectric film is laminated onto the patterned sacrificial material. Finally, another treatment such as a thermal or UV treatment may be performed to eliminate sacrificial material 220, as shown in FIG. 3E in which a plurality of openings are provided within dielectric material 230 to enable formation of microvias. While shown with these particular processes in the embodiments of FIGS. 2A-2D and 3A-3E, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a sacrificial material layer comprising a camphor or polycarbonate material, the sacrificial material layer formed by spin-coating or printing;
    patterning the sacrificial material layer to obtain a first patterned sacrificial material layer;
    embedding the first patterned sacrificial material layer into a dielectric material;
    depositing the dielectric material onto a first side of a core material, the core material including a plurality of conductive interconnections on the first side;
    treating the core material to remove the first patterned sacrificial material layer to provide a patterned dielectric layer having a plurality of openings, the openings corresponding to the removed first patterned sacrificial material layer; and
    forming a plurality of vias in the plurality of openings, wherein each of the vias contacts a corresponding one of the plurality of conductive interconnections.

2. The method of claim 1, wherein embedding the first patterned sacrificial material layer comprises laminating the dielectric material on the first patterned sacrificial material layer, the dielectric material comprising a polymer material.

3. The method of claim 1, wherein treating the core material comprises a thermal treatment or an ultraviolet (UV) treatment and wherein the sacrificial material layer includes a photosensitive material.

4. The method of claim 1, further comprising plating a plurality of plated through holes in the core material to provide contact to the plurality of conductive interconnections prior to depositing the dielectric material.

5. The method of claim 4, further comprising:
    forming a second sacrificial material layer;
    patterning the second sacrificial material layer to obtain a second patterned sacrificial material layer and embedding the second patterned sacrificial material layer into a second dielectric material;
    depositing the second dielectric material onto a second side of the core material; and
    removing the second patterned sacrificial material layer to form a second plurality of vias.

6. The method of claim 1, wherein the dielectric material includes a polyimide, and wherein the polyimide is pressed onto the first patterned sacrificial material layer.

7. The method of claim 6, further comprising plating the vias in the plurality of openings.

8. A method comprising:
    forming a sacrificial material layer including a polycarbonate material;
    patterning the sacrificial material layer to obtain a first patterned sacrificial material layer;
    embedding the first patterned sacrificial material layer into a dielectric material including a polyimide, wherein the polyimide is pressed onto the first patterned sacrificial material layer;
    depositing the dielectric material onto a first side of a core material, the core material including a plurality of conductive interconnections on the first side;
    treating the core material to remove the first patterned sacrificial material layer to provide a patterned dielectric layer having a plurality of openings, the openings corresponding to the removed first patterned sacrificial material layer; and
    forming a plurality of vias in the plurality of openings, wherein each of the vias contacts a corresponding one of the plurality of conductive interconnections.

9. The method of claim 8, wherein treating the core material comprises a thermal treatment or an ultraviolet (UV) treatment and wherein the sacrificial material layer includes a photosensitive material.

10. The method of claim 8, further comprising plating a plurality of plated through holes in the core material to provide contact to the plurality of conductive interconnections prior to depositing the dielectric material.

11. The method of claim 10, further comprising:
    forming a second sacrificial material layer;
    patterning the second sacrificial material layer to obtain a second patterned sacrificial material layer and embedding the second patterned sacrificial material layer into a second dielectric material;
    depositing the second dielectric material onto a second side of the core material; and
    removing the second patterned sacrificial material layer to form a second plurality of vias.

* * * * *